US010312186B2

(12) United States Patent
Yada et al.

(10) Patent No.: US 10,312,186 B2
(45) Date of Patent: Jun. 4, 2019

(54) HEAT SINK ATTACHED TO AN ELECTRONIC COMPONENT IN A PACKAGED DEVICE

(71) Applicant: Amkor Technology, Inc., Tempe, AZ (US)

(72) Inventors: Takahiro Yada, Kumamoto (JP); Toru Takahashi, Kumamoto (JP)

(73) Assignee: Amkor Technology Inc., Tempe, AZ (US)

( * ) Notice: Subject to any disclaimer, the term of this patent is extended or adjusted under 35 U.S.C. 154(b) by 0 days.

(21) Appl. No.: 15/799,941

(22) Filed: Oct. 31, 2017

(65) Prior Publication Data

US 2019/0131219 A1     May 2, 2019

(51) Int. Cl.
| | |
|---|---|
| *H01L 23/495* | (2006.01) |
| *H01L 21/00* | (2006.01) |
| *H01R 9/00* | (2006.01) |
| *H01L 23/31* | (2006.01) |
| *H01L 21/48* | (2006.01) |
| *H01L 21/56* | (2006.01) |

(52) U.S. Cl.
CPC .... *H01L 23/49568* (2013.01); *H01L 21/4821* (2013.01); *H01L 21/4882* (2013.01); *H01L 21/56* (2013.01); *H01L 23/3121* (2013.01); *H01L 23/4952* (2013.01); *H01L 23/49534* (2013.01)

(58) Field of Classification Search
CPC ........... H01L 21/4821; H01L 23/49568; H01L 21/4882; H01L 21/56; H01L 23/3121; H01L 23/4952; H01L 23/49534; H01L 23/3107; H01L 23/49513; H01L 23/49838
See application file for complete search history.

(56) References Cited

U.S. PATENT DOCUMENTS

| | | | |
|---|---|---|---|
| 5,608,267 A * | 3/1997 | Mahulikar | ............ H01L 23/315 257/706 |
| 6,236,568 B1 | 5/2001 | Lai et al. | |
| 8,018,051 B2 * | 9/2011 | Railkar | ............... H01L 23/4334 257/666 |
| 68,018,051 | 9/2011 | Tarak Railkar et al. | |
| 8,304,293 B2 * | 11/2012 | Railkar | ............... H01L 23/4334 257/E21.51 |
| 8,564,124 B2 * | 10/2013 | Briere | ................. H01L 23/3107 257/666 |

(Continued)

*Primary Examiner* — Alonzo Chambliss
(74) *Attorney, Agent, or Firm* — Kevin B. Jackson

(57) ABSTRACT

A method for forming a packaged electronic device includes providing a substrate comprising a lead and a pad. The method includes attaching a thermally conductive structure to the pad and attaching an electronic component to one of the thermally conductive structure or the pad. The method includes electrically coupling the electronic component to the lead, and forming a package body that encapsulates the electronic component and at least portions of the lead, the pad, and the thermally conductive structure, wherein the package body has a first major surface and a second major surface opposite to the first major surface, and one of the first bottom surface of the thermally conductive structure or the bottom surface of the pad is exposed in the first major surface of the package body.

14 Claims, 5 Drawing Sheets

(56) References Cited

U.S. PATENT DOCUMENTS

| | | | |
|---|---|---|---|
| 2001/0045644 A1* | 11/2001 | Huang | H01L 23/4334 257/718 |
| 2006/0001136 A1* | 1/2006 | Tao | H01L 23/49503 257/676 |
| 2006/0175689 A1* | 8/2006 | Shim, II | H01L 23/49537 257/675 |
| 2010/0127369 A1* | 5/2010 | Seki | H01L 21/4821 257/676 |
| 2011/0068445 A1* | 3/2011 | Lin | H01L 21/565 257/675 |
| 2012/0306064 A1 | 12/2012 | Lin | |

* cited by examiner

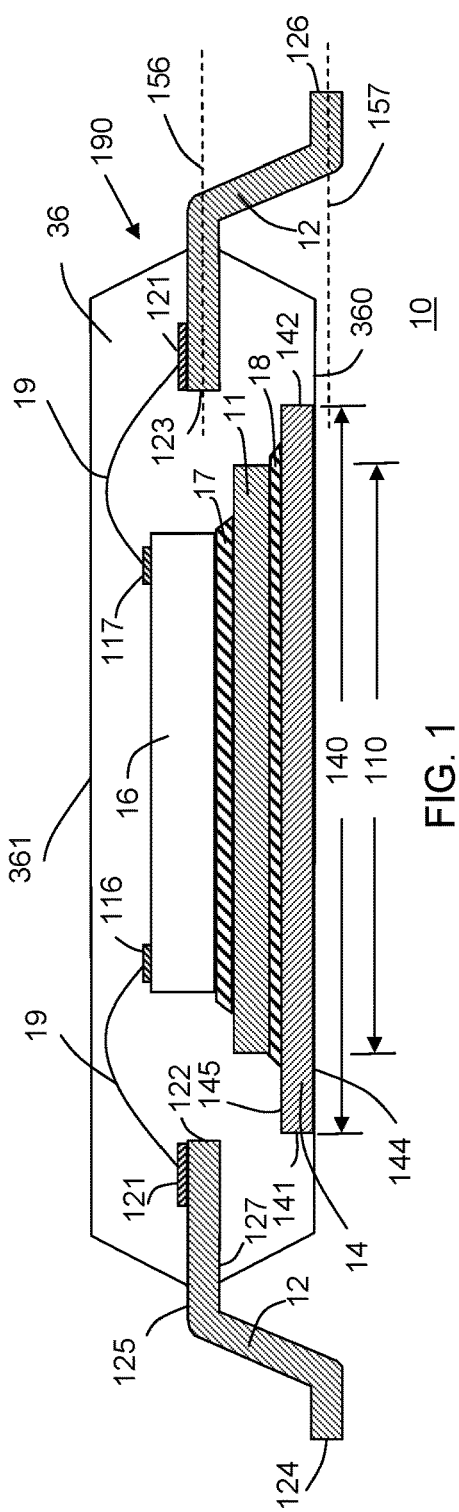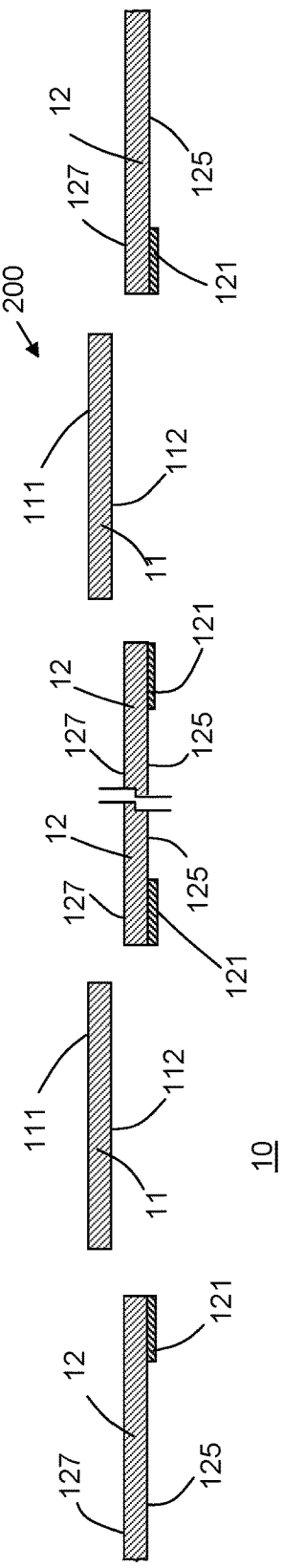

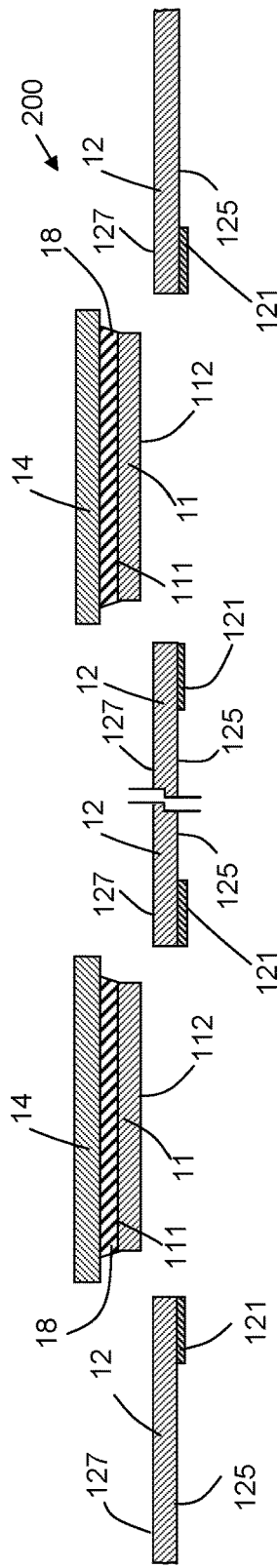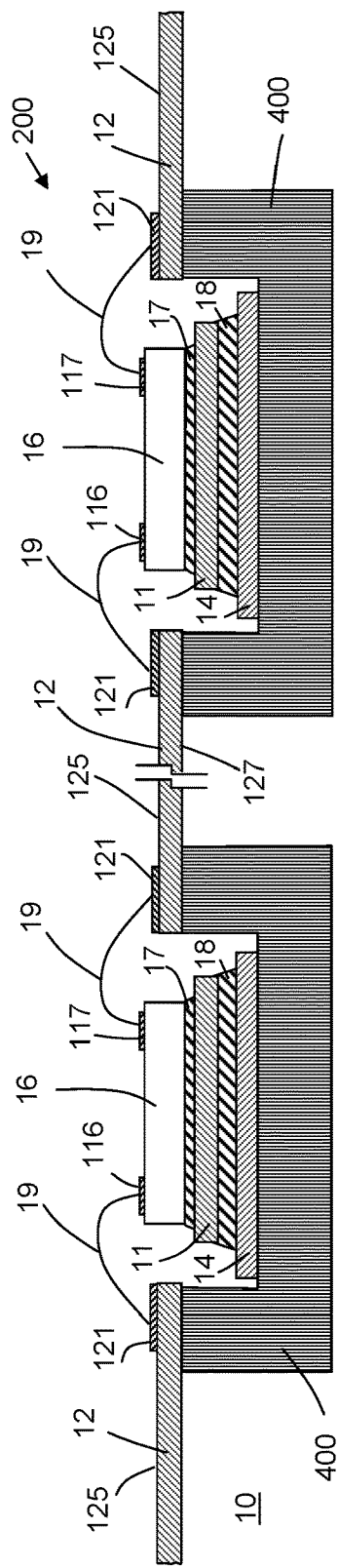

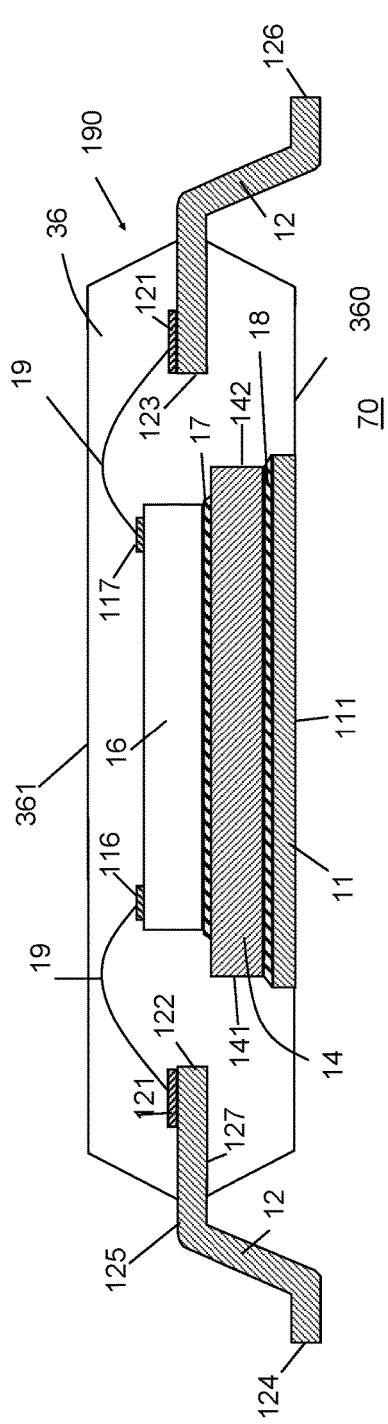
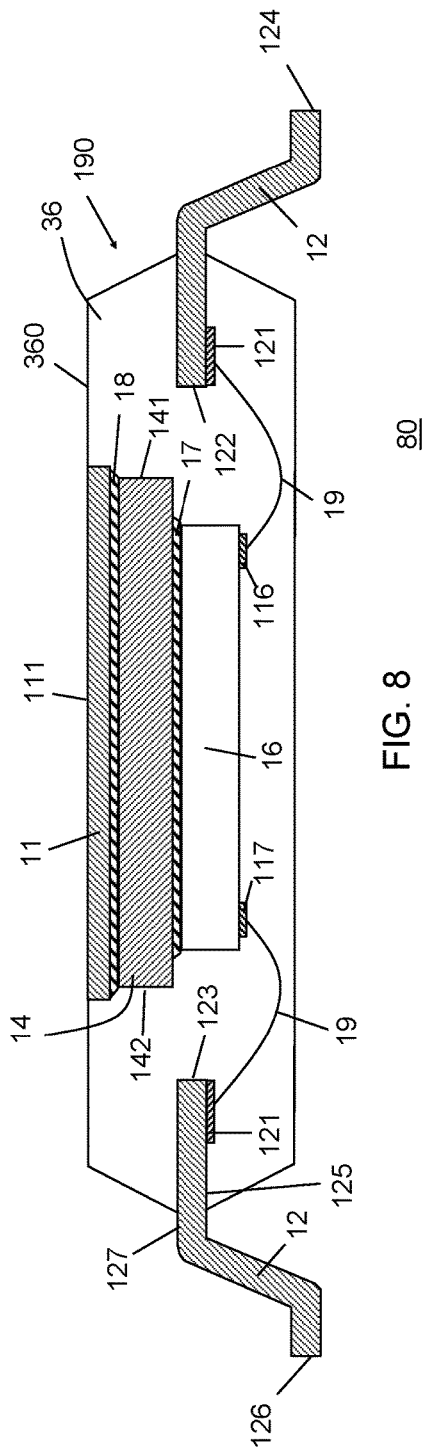

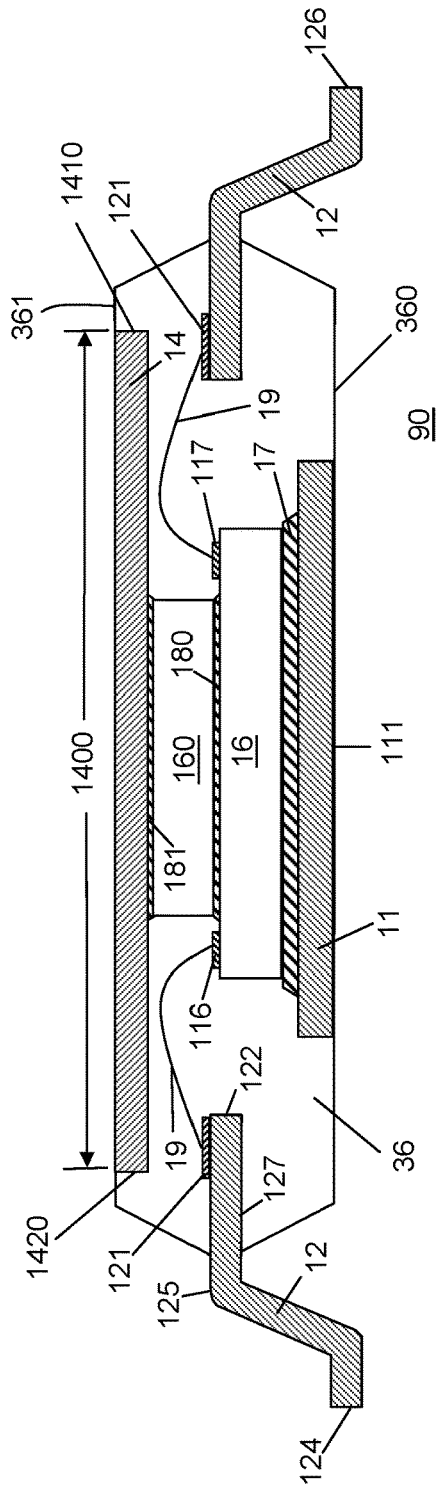
FIG. 9
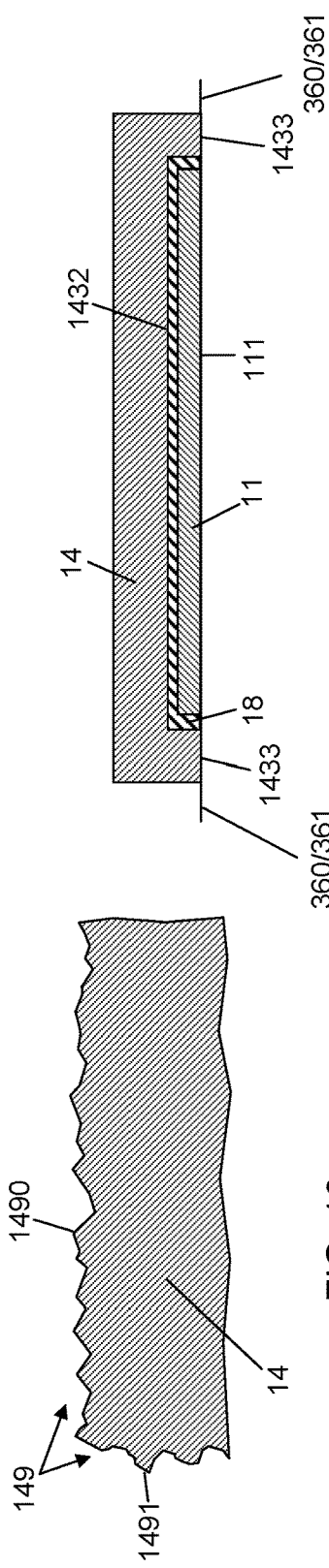
FIG. 11
FIG. 10

HEAT SINK ATTACHED TO AN ELECTRONIC COMPONENT IN A PACKAGED DEVICE

CROSS-REFERENCE TO RELATED APPLICATIONS

Not Applicable.

BACKGROUND OF THE DISCLOSURE

The present disclosure relates, in general, to electronics, and more particularly, to semiconductor packages, structures thereof, and methods of forming semiconductor packages.

Prior semiconductor packages and methods for forming semiconductor packages are inadequate, for example resulting in excess cost, poor thermal performance, decreased reliability, relatively low performance, or package sizes that are too large. Further limitations and disadvantages of conventional and traditional approaches will become apparent to one of skill in the art, through comparison of such approaches with the present disclosure and reference to the drawings.

Accordingly, it is desirable to have a package structure and a method that provides a packaged semiconductor device that overcomes the shortcomings of the prior art. It is also desirable for the structure and method to be easily incorporated into manufacturing flows, accommodate multiple die interconnect schemes, and to be cost effective.

BRIEF SUMMARY

The present description includes, among other features, a packaged electronic device structure and associated method that comprises a separate thermally conductive structure at least partially encapsulated within a package body. In some examples, the thermally conductive structure is attached to a pad bottom surface and an electronic component can be attached to a pad top surface. In other examples, the thermally conductive structure can be attached to the pad top surface and an electronic component can be attached to the thermally conductive structure. In further examples, the thermally conductive structure can be attached to an intervening spacer structure attached to a top surface of the electronic component. The method and structure provide flexibility in the manufacturing process to enable various structures having enhanced thermal performance.

More particularly, in one embodiment, a method for forming a packaged electronic device includes providing a substrate comprising a lead and a pad. The method includes attaching a thermally conductive structure to the pad and attaching an electronic component to one of the thermally conductive structure or the pad. The method includes electrically coupling the electronic component to the lead, and forming a package body that encapsulates the electronic component and at least portions of the lead, the pad, and the thermally conductive structure, wherein the package body has a first major surface and a second major surface opposite to the first major surface, and one of a first bottom surface of the thermally conductive structure or a pad bottom surface is exposed in the first major surface of the package body.

In another embodiment, a method for forming a packaged electronic device includes providing a substrate comprising a lead and a pad, wherein the lead comprises a first end proximate to the pad, a second end distal to the first end, a lead top surface, and a lead bottom surface opposite to the lead top surface; and the pad comprises a pad top surface, an opposing pad bottom surface; and a first width. The method includes attaching a thermally conductive structure to the pad, wherein the thermally conductive structure comprises a first top surface, an opposing first bottom surface, a first side surface, and a second width. The method includes attaching an electronic component to one of the thermally conductive structure or the pad and electrically coupling the electronic component to the lead. The method includes forming a package body that encapsulates the electronic component and at least portions of the lead, the pad, and the thermally conductive structure, wherein the package body has a first major surface and a second major surface opposite to the first major surface, one of the first bottom surface of the thermally conductive structure or the bottom surface of the pad is exposed in the first major surface of the package body and the first side surface of the thermally conductive structure and the first end of the lead are laterally separated so that the first side surface and the first end do not overlap.

In a further embodiment, A packaged electronic device includes a substrate comprising a lead and a pad, wherein the lead comprises a first end proximate to the pad, a second end distal to the first end, a lead top surface, and a lead bottom surface opposite to the lead top surface; and the pad comprises a pad top surface, an opposing pad bottom surface, and a first width. A thermally conductive structure is attached to the pad, wherein the thermally conductive structure comprises a first top surface, an opposing first bottom surface, a first side surface, and a second width. An electronic component is connected to one of the thermally conductive structure or the pad, wherein the electronic component electrically coupled to the lead. A package body encapsulates the electronic component and at least portions of the lead, the pad, and the thermally conductive structure, wherein the package body has a first major surface and a second major surface opposite to the first major surface, one of the first bottom surface of the thermally conductive structure or the bottom surface of the pad is exposed in the first major surface of the package body, and the first side surface of the thermally conductive structure and the first end of the lead are laterally separated so that the first side surface and the first end do not overlap.

Other examples are included in the present disclosure. Such examples may be found in the figures, in the claims, and/or in the description of the present disclosure.

BRIEF DESCRIPTION OF THE DRAWINGS

FIG. 1 illustrates a cross-sectional view of an example packaged electronic device of the present description;

FIGS. 2-5 illustrate cross-sectional views of an example method for manufacturing an example package electronic device of the present description;

FIG. 7 illustrates a cross-sectional view of an example packaged electronic device of the present description;

FIG. 8 illustrates a cross-sectional view of an example packaged electronic device of the present description;

FIG. 9 illustrates a cross-sectional view of an example packaged electronic device of the present description;

FIG. 10 illustrates a partial cross-sectional view of an example thermally conductive structure of the present description; and FIG. 11 illustrates a cross-sectional view of an example thermally conductive structure of the present description connected to a pad.

Figure 5:
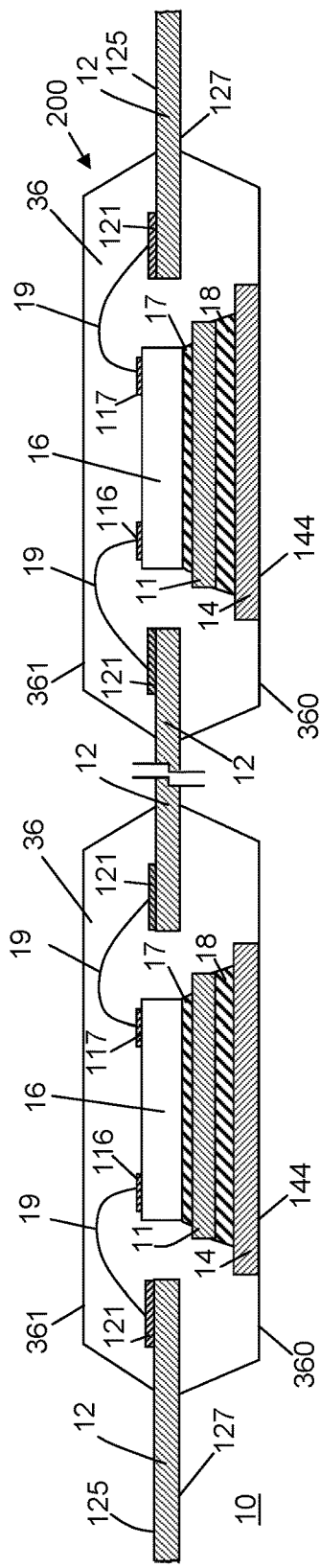

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. It is further understood that the embodiments illustrated and described hereinafter suitably may have embodiments and/or may be practiced in the absence of any element that is not specifically disclosed herein.

DETAILED DESCRIPTION OF THE DRAWINGS

FIG. 1 illustrates a cross-sectional view of an example packaged electronic device 10, such as a packaged semiconductor device 10. The example is illustrated in a thermally enhanced quad flat pack (HQFP) package structure, but the description is not limited to this type of package. In the example illustrated in FIG. 1, packaged semiconductor device 10 can comprise conductive structures 11, 12, and 14, an electronic component 16, such as a semiconductor device 16, protective material 36, and interconnect structures 19.

Semiconductor device 16 can comprise conductive terminal structures 116 and 117. Conductive structures 12 can comprise conductive terminal structures 121. Semiconductor device 16 can be attached to conductive structure 11 with an attach material 17, which can be a thermally conductive and electrically conductive material, or a thermally conductive and electrically non-conductive material. Conductive structure 11 can be attached to conductive structure 14 with an attachment material 18, which can be a thermally conductive and electrically conductive material, or a thermally conductive and electrically non-conductive material.

Interconnect structures 19, protective material 36, conductive structures 11, 12, and 14, conductive terminal structure 116, 117, and 121, and attachment materials 17 and 19 can be referred to as a semiconductor package 190 and package 190 can provide protection for semiconductor device 16 from external elements and/or environmental exposure. In addition, semiconductor package 190 can provide electrical coupling from external electrical components (not shown) to conductive terminal structures 116 and 117.

In the present example, conductive structure 11 can be referred to as a pad 11, flag 11, die attach pad 11, die pad 11, or support pad 11 and conductive structures 12 can be referred to as leads 12 or terminals 12, which are disposed proximate to, but separated from, pad 11. Pad 11 includes a pad top surface 112 and an opposing pad bottom surface 111. Pad top surface 112 is generally the surface of pad 11 proximate to semiconductor device 16 and pad bottom surface 111 is generally the surface of pad 11 distal to semiconductor device 16. Leads 112 include a lead top surface 125 and an opposing lead bottom surface 127. Conductive structure 14 can be referred to as thermally conductive structure 14, heat sink 14, thermal spreader 14, or heat transfer structure 14. Thermally conductive structure 14 comprises a top surface 145, an opposing bottom surface 144, and opposing side surfaces 141 and 142. In the present example, thermally conductive structure 14 has a width 140 that is wider or larger than width 110 of pad 11. This is a beneficial feature because it increases the surface area exposed the outside of package body 36 to improve heat transfer performance compared to previous devices that rely solely on pad 11 for heat transfer. In addition, thermally conductive structure 14 can be subjected to a roughening process, such as a chemical, mechanical, or plating process to improve the adhesion between thermally conductive structure 14 and package body 36, which improves the reliability of packaged semiconductor device 10. Another feature of the present example is that opposing side surfaces 141 and 142 of thermally conductive structure 14 are disposed laterally inside where proximate ends 122 and 123 of leads 12 are disposed. Stated a different way, proximate end 122 and side surface 141 do not laterally overlap, and proximate end 123 and side surface 142 do not overlap. As described later, this feature facilitates the placement of a heat block, which is used during the formation of interconnect structures 19, directly underneath leads 12 to provide enhanced support of leads 12 during this formation step.

In the example shown, leads 12 are provided with a bent shape such that distal ends 124 and 126 of leads 12 reside within a first plane 157 and proximate ends 122 and 123 of leads reside within a second plane 156 that is different than first plane 157. As illustrated in FIG. 1, first plane 157 and second plane 156 are generally parallel to top surface 145 of thermally conductive structure 14. In other examples, leads 12 can comprise other shapes or can be configured to provide packaged semiconductor device 10 as a leadless package. In the present example, thermally conductive structure 14 and distal ends 124 and 126 of leads 12 are proximate to a major surface 360 of package body 36, which is opposite to a major surface 361.

In some embodiments, semiconductor device 16 is an integrated circuit device, a power semiconductor device, an optical device, a sensor device, or other devices as known to those skilled in the art. By way of example, attach materials 17 and 18 can be a solder paste, a conductive epoxy, conductive adhesives, conductive films, non-conductive epoxy, non-conductive adhesives, non-conductive films, or other suitable attach materials as known to those skilled in the art. In some embodiments, non-conductive refers to electrically insulating and it is understood that such materials may still be thermally conductive. Those skilled in the art will appreciate that semiconductor device 16 is illustrated in simplified form, and may further include multiple diffused regions, multiple conductive layers, and multiple dielectric layers.

FIGS. 2-6 illustrate cross-sectional views of an example method for manufacturing packaged semiconductor devices 10. FIG. 2 illustrates packaged semiconductor devices 10 at an early stage of manufacture.

In the example illustrated in FIG. 2, a conductive substrate 200, such as a conductive lead frame 200 is provided. In some examples, conductive lead frame 200 comprises one or more metal materials, such as copper, a copper alloy, nickel-iron-cobalt alloys, iron-nickel alloys (e.g., Alloy 42), plated materials, or other materials known to those skilled in the art. Conductive lead frame 200 can comprise a thickness of about 200 microns or less in some example embodiments. Conductive lead frame 200 comprises pads 11 and leads 12, which reside on different planes in the present example. Conductive lead frame 200 can be formed using etching, stamping, punching, and other processes known to those skilled in the art. Although not shown, conductive lead frame 200 can further comprises frame structures, tie bar structures, and other supporting structures that hold pads 11 and leads 12 together during the manufacturing process. Conductive terminals 121 are disposed on portions of leads 12, and can be formed using evaporation, plating, deposition, or other processes known to those skilled in the art. Masking materials (not shown) can be used to selectively provide conductive terminals 121 in desired locations on leads 12. Conductive terminals 121 can be metal materials, such as silver, gold, or other materials known to those skilled in the art.

In the present example, conductive lead frame 200 is provided in a flipped orientation so that pad bottom surfaces 111 are facing upward and lead top surfaces 125 are facing downward. It is understood that conductive lead frame 200 can comprise additional pads 11 and leads 12 than illustrated in FIG. 2.

In the present example, pads 11 can be configured to support semiconductor devices 16, to transfer heat away from semiconductor device 16 to thermally conductive structures 14, and in some examples, to provide electrical communication to and from semiconductor device 16. Leads 12 can be configured to provide electrical communication to and from semiconductor device 16 and to physically attach packaged semiconductor device 10 to a next level of assembly, such as a printed circuit board. Conductive terminals 121 can be configured to facilitate the attachment of conductive interconnect structures 19 to leads 12.

FIG. 3 illustrates a cross-sectional view of packaged semiconductor devices 10 at a later stage of manufacture. In the example illustrated in FIG. 3, conductive structures 14 configured as thermally conductive structures 14 are attached to pad bottom surfaces 111 using attach material 18. Thermally conductive structures 14 can comprise one or more metals with high thermal conductivity such as copper, a copper alloy, nickel-iron-cobalt alloys, iron-nickel alloys (e.g., Alloy 42), plated materials, or other high thermal conductivity materials known to those skilled in the art. Thermally conductive structures 14 can be formed using etching, stamping, or other process techniques known to those skilled in the art. In some examples, thermally conductive structures 14 are thicker than pads 11 with a thickness in a range from about 225 microns to about 275 microns being typical. One feature of the present example is that by providing thermally conductive structures 14 with a greater thickness than pads 11, pads 11 can be the same thickness as leads 12 to simplify the process of forming lead frame 200. In other examples, as illustrated in FIGS. 7 and 8, thermally conductive structure 14 can be attached to pad top surface 112. One advantage of the present examples is that pads 11 and leads 12 can have the same thickness, which simplifies manufacturing including the manufacturing of lead frame 200. Thermally conductive structure 14 can be added to improve thermal performance. This also adds manufacturing flexibility because lead frame 200 can then be used for packaged electronic devices that do not require an additional thermally conductive structure.

As described previously, in some examples, all or some of the outer or exterior surfaces of the thermally conductive structures 14 are subjected to a surface roughening process, such as a chemical etching process, a sandblasting process, a plating process, or other processes known to those skilled in the art. These processes are used to form outer surfaces that are non-planar such that the outer surfaces change in the z-direction thereby increasing the exposed surface area. An example illustration of thermally conductive structure 14 with roughened outer surfaces 149 is provided in FIG. 10, which is a partial cross-sectional view of thermally conductive structure 14 illustrating a partial outer top surface 1491 and a partial outer side surface 1492 both with a roughened surface finish. The roughening process can be done prior to attaching thermally conductive structures 14 to die pads 11.

In the present example, thermally conductive structures 14 are configured to provide a means of heat or thermal transfer from semiconductor device 16 to the outside of packaged semiconductor device 10. In addition, thermally conductive structures 14 can be configured to enhance adhesion with package body 36 by surface roughening or other techniques, such as half-etched portions 147 illustrated, for example, in FIG. 6. Thermally conductive structures 14 can further comprise other mold locking structures to promote adhesion with package body 36, such as slots, holes, or other structures known to those skilled in the art. In some examples, surface roughening is preferred to maintain as much of the thermally conductive structures as possible for heat transfer.

Attach material 18 can comprise a solder paste (e.g., lead/tin, bismuth/silver alloys, gold/tin), a paste adhesive material (e.g., copper-filled adhesive), a film adhesive material (e.g., B-staged materials), an epoxy material (e.g., silver-filled epoxy), or other suitable attach materials known to those skilled in the art. Attach material 18 can be formed using dispensing processes, screen printing processes, pad-printable processes, solder wire processes, or other processes known to those skilled in the art. Attach material 18 can comprise an electrically conductive material or an electrically insulating material. Attach material 18 comprises a thermally conductive material thereby facilitating thermal conductivity between semiconductor devices 16 and thermally conductive structures 14. Attach material 18 further functions to mechanically fix thermally conductive structures 14 to pads 11. In some examples, it is preferred to attach thermally conductive structures 14 to pads 11 before semiconductor devices 16 are attached to pads 11. This is to prevent semiconductor devices 16 from being damaged or exposed to unnecessary processing during the attachment of thermally conductive structures 14 thereby improving the reliability of packaged semiconductor devices 10.

FIG. 4 illustrates a cross-sectional view of packaged semiconductor devices 10 at a further stage of manufacture. In the example illustrated in FIG. 4, the orientation of lead frame 200 is flipped such that lead top surfaces 125 are facing upward. Semiconductor die 16 then can be attached to pads 11 using attach material 17. Attach material 17 can comprise a solder paste (e.g., lead/tin, bismuth/silver alloys, gold/tin), a paste adhesive material (e.g., copper-filled adhesive), a film adhesive material (e.g., B-staged materials), an epoxy material (e.g., silver-filled epoxy), or other suitable attach materials known to those skilled in the art. Attach material 17 can be formed using dispensing processes, screen printing processes, pad-printable processes, solder wire processes, or other processes known to those skilled in the art. Attach material 17 can comprise an electrically conductive material or an electrically insulating material. Attach material 17 comprises a thermally conductive material thereby facilitating thermal conductivity between semiconductor devices 16 and thermally conductive structures 14. Attach material 17 further functions to mechanically fix semiconductor devices 16 to pads 11.

Interconnect structures 19 can then be attached to conductive terminal structures 116, 117, and 121. In the example illustrated in FIG. 4, interconnect structures 19 can comprise conductive wires, which are wire bonded to conductive terminal structures 116 and conductive terminal structures 121 and to conductive terminal structures 117 and conductive terminal structures 121. In some examples, interconnect structures 19 comprise metal materials, such a copper, aluminum, silver, gold, or other materials as known to those skilled in the art. One feature of the present example is that the width 140 (illustrated in FIG. 1) is selected such that thermally conductive structures 14 fit within heater plates 400 or heater structures 400 such that heater plates 400 can physically support leads 12 directly underneath conductive terminals 121 during the wire bonding process. In other embodiments, interconnect structures 19 can comprise clips, ribbon bonds, or other interconnect structures known to those skilled in the art. Interconnect structures 19 are configured to facilitate electrical communication between semiconductor die 16 and other components including components internal or external to packaged semiconductor device 10. In further examples, conductive terminals 116 and 117 of semiconductor device 16 can be directly attached to leads 12 using an attach material.

FIG. 5 illustrates a cross-sectional view of packaged semiconductor devices 10 after still further manufacture. In the example illustrated in FIG. 5, package bodies 36 can be formed so as to encapsulate semiconductor devices 16, interconnect structures 19, pads 11, attach materials 17 and 18, portions of thermally conductive structures 14, and portions of leads 12. In the present embodiment, at least bottom surfaces 144 of thermally conductive structures 14 are exposed to the outside of package bodies 36 so as to better facilitate thermal performance of packaged semiconductor devices 10. In some examples, package body 36 can be polymer based composite material, such as epoxy resin with filler, epoxy acrylate with filler, or polymer with proper filler. Package body 36 comprises a non-conductive and environmentally protective material that functions to protect semiconductor devices 16 from external elements and contaminants. Package body 36 may be formed using paste printing, compressive molding, transfer molding, overmolding, liquid encapsulant molding, vacuum lamination, other suitable applicator, or other processes as known to those of skill in the art. In some embodiments, package body 36 is an epoxy mold compound ("EMC"), and can be formed using transfer or injection molding techniques.

In one or more subsequent steps, leads 12 of packaged semiconductor device 10 can be severed at predetermined locations, and a forming process, such as a bending process, can be used to form leads 12 into desired shapes, such as the example shapes illustrated in FIG. 1.

Figure 6:
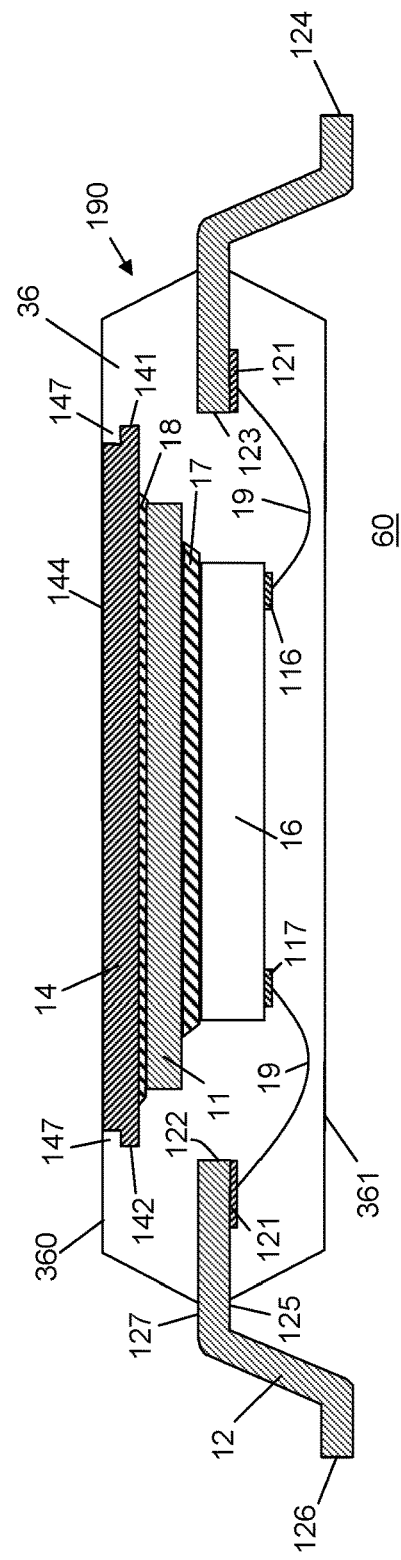
FIG. 6 illustrates a cross-sectional view of an example packaged electronic device of the present description.

FIG. 6 illustrates a cross-sectional view an example of a packaged electronic device 60, such as a packaged semiconductor device 60. The example is illustrated in a thermally enhanced quad flat pack (HQFP) package structure, but the description is not limited to this type of package. Packaged semiconductor device 60 is similar to packaged semiconductor device and only the differences will be described in detail. In the present example, thermally conductive structure 14 is exposed to the outside of package body 36 at major surface 360 while distal ends 124 and 126 of leads 12 are formed so as to be proximate to major surface 361 of package body 36. In this example, thermally conductive structure 14 faces upward when packaged semiconductor device 60 is attached to a next level of assembly, such as a printed circuit board. Stated a different way, semiconductor device 16 is disposed in a downward orientation and thermally conductive structure 14 is disposed in an upward orientation. With the upward orientation of thermally conductive structure 14, an additional heat sinking device (e.g., a conductive finned structure) can be added to packaged semiconductor device 60 to further enhance thermal performance of packaged semiconductor device 60.

In the present example, thermally conductive structure 14 is further illustrated with recessed portions 147 disposed inward from bottom surface 144 of thermally conductive structure 14. Recessed portions 147 can be formed using half-etching processes or stamping processes. Recessed portions 147 function to improve adhesion between thermally conductive structure 14 and package body 36. It is understood that recessed portions 147 can be used with any of the examples described and illustrated in the present description.

FIG. 7 illustrates a cross-sectional view an example of a packaged electronic device 70, such as a packaged semiconductor device 70. The example is illustrated in a thermally enhanced quad flat pack (HQFP) package structure, but the description is not limited to this type of package. Packaged semiconductor device 70 is similar to packaged semiconductor device 10 and only the differences will be described in detail. In the present example, pad bottom surface 111 is exposed to the outside of package body 36 through major surface 360, and thermally conductive structure 14 is attached to pad 11 with attach layer 18. In this example, thermally conductive structure 14 can be the same width as pad 11 or can have a smaller width than pad 11. In one preferred example, thermally conductive structure 14 can comprise roughened outer surface 149 as illustrated, for example, in FIG. 10 so as to improve the adhesion between package body 36 and thermally conductive structure 14, which improves the reliability of packaged semiconductor device 70. In an example method of manufacture, thermally conductive structure 14 is first attached to pad 11 with attach material 18 before semiconductor device 16 is attached to thermally conductive structure 14 with attach layer 17. In a preferred example, thermally conductive structure 14 is thicker than pad 11 as generally illustrated in FIG. 7 to provide more thermally conductive volume to remove heat away from semiconductor device 16. One advantage of the present example is that pad 11 and leads 12 can have the same thickness that simplifies manufacturing and thermally conductive structure 14 can be added to improve thermal performance.

In an alternative embodiment for packaged semiconductor device 70, thermally conductive structure 14 can be wider than pad 11 and further provided with a recessed portion 1432 that encloses a portion of pad 11 and attach layer 18, but leaving pad bottom surface 111 exposed as illustrated in FIG. 11. In this example, end portions 1433 of thermally conductive structure 14 can also be exposed to the outside of package body 36 (through, for example, major surface 360 or major surface 361) to further enhance thermal performance. In this example, thermally conductive structure 14 can further comprise roughened outer surface 149 as illustrated in FIG. 10 to enhance adhesion with package body 36.

FIG. 8 illustrates a cross-sectional view of an example of a packaged electronic device 80, such as a packaged semiconductor device 80. The example is illustrated in a thermally enhanced quad flat pack (HQFP) package structure, but the description is not limited to this type of package. Packaged semiconductor device 80 is similar to packaged semiconductor device 70 and only the differences will be described in detail. In the present example, pad bottom surface 111 is exposed to the outside of package body 36 at major surface 360 while distal ends 124 and 126 of leads 12 are formed so as to be proximate to major surface 361 of package body 36. In this example, pad 11 faces upward when packaged semiconductor device 80 is attached to a next level of assembly, such as a printed circuit board. Stated a different way, semiconductor device 16 is disposed in a downward orientation and pad 11 is disposed in an upward orientation. With the upward orientation of pad 11, an additional heat sinking device (e.g., a conductive finned structure) can be added to packaged semiconductor device 80 to further enhance thermal performance of packaged semiconductor device 80. In another example, packages semiconductor device 80 can comprise the thermally conductive structure 14 example structure illustrated in FIG. 11.

FIG. 9 illustrates a cross-sectional view of an example of a packaged electronic device 90, such as a packaged semiconductor device 90. The example is illustrated in a thermally enhanced quad flat pack (HQFP) package structure, but the description is not limited to this type of package. Packaged semiconductor device 90 can comprise a spacer structure 160 attached to semiconductor device 16 with an attach material 180. In one example, spacer structure 160 can comprise a material having a thermal expansion coefficient similar to semiconductor device 16. In the present example, spacer structure 160 can comprise a semiconductor material, such as silicon. Spacer structure 160 is configured to provide a stand-off between semiconductor device 16 and thermally conductive structure 14. In some examples, thermally conductive structure 14 can be attached to spacer structure 160 with an attach material 181. Attach materials 180 and 181 can be similar materials to attach materials 17 and 18 described previously. In the present example, heat transfer is achieved through both major surfaces 360 and 361 of package body 36 using both thermally conductive structure 14 and pad 11. Stated a differently way, pad bottom surface 111 is exposed to the outside of package body 36 through major surface 360 and surface 144 of thermally conductive structure 14 is exposed to the outside of package body 36 through opposing major surface 361.

One feature of the present example is that width 1400 can be wider than pad 11. Further, in some examples, side surfaces 1410 and 1420 of thermally conductive structure 14 can laterally extend to overlap proximate ends 122 and 123 of leads 12 to provide more exposed surface area of thermally conductive structure 14 to further enhance heat transfer. In some examples, thermally conductive structure 14 can include roughened surface 149 as illustrated in FIG. 10 to enhance adhesion with package body 36. Ina method of fabricating packaged semiconductor device 90, spacer structure 160 and thermally conductive structure 14 can be attached to semiconductor device 16 after interconnect structures 19 are provided. In other examples, spacer structure 160 can be first attached to semiconductor device 16, interconnect structures 19 then provided, and then thermally conductive structure 14 provided. In further examples, spacer structure 160 can be first attached to thermally conductive structure 14 and then attached to semiconductor device 16. Similar to the other examples described, thermally conductive structure 14 can comprises roughened outer surface 149 as illustrated in FIG. 10 to enhance adhesion with package body 36.

In summary, methods for forming a packaged electronic device and related packaged electronic device structures have been disclosed including a thermally conductive structure attached to a pad for improving the thermal performance of the device. In some examples the thermally conductive structure is attached to a pad bottom surface and is exposed to the outside of a package body, which is provided to encapsulate an electronic component. In other examples, the thermally conductive structure is attached to a pad top surface and the pad bottom surface is exposed to the outside of the package body. In some examples outer surfaces of the thermally conductive structure are subjected to a roughening process to improve adhesion with the package body. In some examples, the outer side surfaces of the thermally conductive structure do not laterally lap proximate ends of the leads. This enables a more reliable process that directly supports the leads during the process to form interconnect structures. In some examples, distal ends of the leads are proximate to one major surface of the package body and the either the pad or the thermally conductive structure is exposed to the outside through an opposing major surface. In some examples, the thermally conductive structure can be wider and/or thicker than the pad. In other examples, the pad can be wider than the thermally conductive structure.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. By way of example, multiple electronic devices can be attached to a pad in side-by-side configurations, in stacked configurations, combinations thereof, or other configurations known to those skilled in the art. In addition, the packaged electronic device can leads on less than all sides of the package body.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A method for forming a packaged electronic device, comprising:
   providing a substrate comprising a lead and a pad, wherein:
      the lead comprises:
         a first end proximate to the pad;
         a second end distal to the first end;
         a lead top surface; and
         a lead bottom surface opposite to the lead top surface; and
      the pad comprises:
         a pad top surface;
         a pad bottom surface opposite to the pad top surface; and
         a first width;
   attaching a thermally conductive structure to the pad bottom surface, wherein:
      the thermally conductive structure comprises:
         a first top surface;
         a first bottom surface opposite to the first top surface;
         a first side surface; and
         a second width;
   attaching an electronic component to the pad top surface after the step of attaching the thermally conductive structure;
   electrically coupling the electronic component to the lead adjacent the first end of the lead after the step of attaching the electronic component; and
   forming a package body that encapsulates the electronic component and at least portions of the lead, the pad, and the thermally conductive structure, wherein:
      the package body has a first major surface and a second major surface opposite to the first major surface;
      the first bottom surface of the thermally conductive structure is exposed in the first major surface of the package body;
      the second width is greater than the first width;
      the first end of the lead does not laterally overlap the first top surface of the thermally conductive structure in a cross-sectional view;
      the method further comprises bending the lead such that the second end resides within a first plane and the first end resides within a second plane, which is generally parallel to the first plane; and
      the first plane is adjacent to the second major surface of the package body.

2. The method of claim 1, wherein:
   the method further comprises providing a conductive terminal on the lead top surface proximate to the first end of the lead; and
   electrically coupling the electronic component to the lead comprises:
      placing the pad and the thermally conductive structure within a heater structure such that the heater structure accommodates the thermally conductive structure and directly supports the lead proximate to the conductive terminal; and
      thereafter attaching an interconnect structure to the conductive terminal and the electronic component.

3. The method of claim 1 further comprising exposing outer surfaces of the thermally conductive structure to a roughening process prior to attaching the thermally conductive structure to the pad.

4. A method for forming a packaged electronic device, comprising:
   providing a substrate comprising a lead and a pad, wherein:
      the lead comprises:
         a first end proximate to the pad;
         a second end distal to the first end;
         a lead top surface; and
         a lead bottom surface opposite to the lead top surface; and
      the pad comprises:
         a pad top surface;
         an opposing pad bottom surface; and
         a first width;
   attaching a thermally conductive structure to the pad, wherein:
      the thermally conductive structure comprises:
         a first top surface;
         an opposing first bottom surface;
         a first side surface; and
         a second width greater than the first width;
   attaching an electronic component to one of the thermally conductive structure or the pad after the step of attaching the thermally conductive structure to the pad;
   electrically coupling the electronic component to the lead; and
   forming a package body that encapsulates the electronic component and at least portions of the lead, the pad, and the thermally conductive structure, wherein:
      the package body has a first major surface and a second major surface opposite to the first major surface;
      one of the first bottom surface of the thermally conductive structure or the bottom surface of the pad is exposed in the first major surface of the package body;
      the first side surface of the thermally conductive structure and the first end of the lead are laterally separated so that the first side surface and the first end do not overlap; and
   electrically coupling the electronic component to the lead comprises:
      placing the pad and thermally conductive structure within a support structure such that the support structure directly supports the lead and accommodates the thermally conductive structure; and
      thereafter attaching an interconnect structure to the lead and the electronic component.

5. The method of claim 4, wherein:
   attaching the thermally conductive structure comprises attaching the thermally conductive structure to the pad bottom surface; and
   forming the package body comprises exposing the first bottom surface of the thermally conductive structure in the first major surface of the package body.

6. The method of claim 4, wherein the second end of the lead is disposed closer to the first major surface of the package body than the second major surface of the package body.

7. The method of claim 4, wherein the second end of the lead is disposed closer to the second major surface of the package body than the first major surface of the package body.

8. The method of claim 4, wherein the first end and the second end of the lead reside within different planes that are generally parallel to the first top surface of the thermally conductive structure.

9. The method of claim 4 further comprising exposing outer surfaces of the thermally conductive structure to a roughening process prior to attaching the thermally conductive structure to the pad.

10. The method of claim 4, wherein:
placing the pad and thermally conductive structure within the support structure comprises placing the pad and thermally conductive structure within a heater structure.

11. The method of claim 4, wherein:
attaching the thermally conductive structure comprises attaching the thermally conductive structure to the pad top surface; and
forming the package body comprises exposing the pad bottom surface in the first major surface of the package body.

12. The method of claim 11, wherein:
attaching the thermally conductive structure comprises attaching a thermally conductive structure, wherein:
the thermally conductive structure comprises a recessed portion that encloses a portion of the pad; and
the pad bottom surface and end portions of the thermally conductive structure are exposed in the first major surface of the package body.

13. The method of claim 11, wherein the thermally conductive structure is thicker than the pad.

14. A packaged electronic device comprising:
a substrate comprising a lead and a pad, wherein:
the lead comprises:
a first end proximate to the pad;
a second end distal to the first end;
a lead top surface; and
a lead bottom surface opposite to the lead top surface; and
the pad comprises:
a pad top surface;
an opposing pad bottom surface;
a pad side surface extending between the pad top surface and the pad bottom surface; and
a first width;
a thermally conductive structure, wherein:
the thermally conductive structure comprises:
a first top surface;
an opposing first bottom surface;
a recessed portion formed extending inward from the first bottom surface; and
a second width; and
the thermally conductive structure is attached to the pad such that:
the pad is disposed within the recessed portion; and
the thermally conductive structure is attached to the pad top surface and the pad side surface;
an electronic component coupled to the thermally conductive structure and electrically coupled to the lead; and
a package body encapsulating the electronic component and at least portions of the lead and the thermally conductive structure, wherein:
the package body has a first major surface and a second major surface opposite to the first major surface; and
the pad bottom surface and portions of the thermally conductive structure are exposed in the first major surface of the package body.

\* \* \* \* \*